(12) United States Patent
Kabir et al.

(10) Patent No.: US 10,770,390 B2
(45) Date of Patent: Sep. 8, 2020

(54) ENERGY STORING INTERPOSER DEVICE AND MANUFACTURING METHOD

(71) Applicant: Smoltek AB, Göteborg (SE)

(72) Inventors: M Shafiqul Kabir, Västra Frölunda (SE); Anders Johansson, Öckerö (SE); Muhammad Amin Saleem, Göteborg (SE); Rickard Andersson, Göteborg (SE); Vincent Desmaris, Göteborg (SE)

(73) Assignee: SMOLTEK AB, Gothenburg (SE)

( * ) Notice: Subject to any disclaimer, the term of this patent is extended or adjusted under 35 U.S.C. 154(b) by 0 days.

(21) Appl. No.: 16/463,970

(22) PCT Filed: Aug. 23, 2018

(86) PCT No.: PCT/SE2018/050848
§ 371 (c)(1),
(2) Date: May 24, 2019

(87) PCT Pub. No.: WO2019/045619
PCT Pub. Date: Mar. 7, 2019

(65) Prior Publication Data
US 2020/0091065 A1    Mar. 19, 2020

(30) Foreign Application Priority Data
Aug. 29, 2017    (SE) ..................... 1751034

(51) Int. Cl.
*H01L 23/522*    (2006.01)
*H01L 21/768*    (2006.01)
(Continued)

(52) U.S. Cl.
CPC ...... *H01L 23/5223* (2013.01); *H01L 21/7684* (2013.01); *H01L 23/29* (2013.01);
(Continued)

(58) Field of Classification Search
None
See application file for complete search history.

(56) References Cited

U.S. PATENT DOCUMENTS 7,416,954 B2    8/2008    Block et al.
7,488,624 B2    2/2009    Horton et al.
(Continued)

OTHER PUBLICATIONS

Notification of Transmittal of the International Search Report and the Written Opinion of the International Searching Authority, or the Declaration, from PCT/SE2018/050848, dated Nov. 6, 2018.

*Primary Examiner* — Lex H Malsawma
(74) *Attorney, Agent, or Firm* — Westman, Champlin & Koehler, P.A.

(57) ABSTRACT

An interposer device comprising a first conductor pattern on a first side defining a portion of the interposer device to be covered by a first electrical circuit element; and a second conductor pattern on a second side to be connected to a second electrical circuit element. The second conductor pattern is electrically coupled to the first conductor pattern. The interposer device further comprises a plurality of nanostructure energy storage devices arranged within the portion of the interposer device to be covered by the first electrical circuit element. Each of the nanostructure energy storage devices comprises at least a first plurality of conductive nanostructures; a conduction controlling material embedding the nanostructures; a first electrode connected to each nanostructure in the first plurality of nanostructures; and a second electrode separated from each nanostructure in the first plurality of nanostructures by the conduction controlling material.

33 Claims, 4 Drawing Sheets

(51) Int. Cl.
*H01L 23/29* (2006.01)
*H01L 23/00* (2006.01)
*H01L 49/02* (2006.01)
*B82Y 30/00* (2011.01)

(52) U.S. Cl.
CPC ............ H01L 24/05 (2013.01); H01L 28/40 (2013.01); *B82Y 30/00* (2013.01); *H01L 2224/02371* (2013.01)

(56) References Cited

U.S. PATENT DOCUMENTS

| | | |
|---|---|---|
| 7,518,881 B2 | 4/2009 | Cornelius |
| 8,263,434 B2 | 9/2012 | Pagaila et al. |
| 8,270,137 B2 | 9/2012 | Briere et al. |
| 8,344,512 B2 * | 1/2013 | Knickerbocker ..... H01L 21/486 |
| | | 257/773 |
| 8,426,961 B2 | 4/2013 | Shih et al. |
| 8,618,651 B1 | 12/2013 | Yee |
| 8,928,132 B2 | 1/2015 | Choi et al. |
| 8,963,287 B1 | 2/2015 | Tian et al. |
| 9,165,793 B1 | 10/2015 | Wang et al. |
| 9,236,442 B2 | 1/2016 | Bhagavat et al. |
| 9,257,383 B2 | 2/2016 | England |
| 9,349,669 B2 | 5/2016 | Uzoh et al. |
| 9,396,883 B2 | 7/2016 | Pande et al. |
| 9,397,038 B1 | 7/2016 | Uzoh et al. |
| 2004/0108587 A1 * | 6/2004 | Chudzik ................. H01L 23/50 |
| | | 257/700 |
| 2006/0214262 A1 | 9/2006 | Mosley et al. |
| 2007/0035030 A1 * | 2/2007 | Horton .............. H01L 23/49822 |
| | | 257/773 |
| 2016/0148903 A1 | 5/2016 | Su et al. |
| 2019/0051591 A1 * | 2/2019 | Kabir .................... H01L 21/486 |

* cited by examiner

ENERGY STORING INTERPOSER DEVICE AND MANUFACTURING METHOD

CROSS-REFERENCE TO RELATED APPLICATION

This Application is a Section 371 National Stage Application of International Application No. PCT/SE2018/050848, filed Aug. 23, 2018 and published as WO 2019/045619 on Mar. 7, 2019, in English, and which claims priority to Swedish Patent Application No. 1751034-8 filed on Aug. 29, 2017, the contents of which are hereby incorporated by reference in their entirety.

FIELD OF THE INVENTION

The present invention relates to an interposer device for electrically and mechanically interconnecting a first electrical circuit element and a second electrical circuit element. The present invention also relates to a method of manufacturing such an interposer device.

BACKGROUND OF THE INVENTION

Electronic devices need electrical energy to operate. In a portable electronic device, a battery is typically provided, and electrical energy is drawn from the battery to power integrated circuits comprised in the electronic device. Moreover, a number of driving factors that are continuously improving the system level performance including but not limited to smaller form-factor with higher data transfer rate, signal integrity, memory bandwidth, power and thermal management capability etc. It is of highest importance that the today's integrated and portable products are continuously striving to improve at least those metrics. The maturity of the Through Silicon Via (TSV) technology has opened up enormous possibilities for homogenous and heterogeneous integration of logic, analog, sensors and memory co-located closely together in a small form-factor assembly. Moreover, TSV technology breakthrough and maturity has enabled exploiting the possibilities of advancing the interposer packaging technology to the next level. Some good examples of interposers including TSV are disclosed in U.S. Pat. Nos. 8,426,961 B2, 8,928,132B2, 8,426,961 B2, 8,263,434B2. Adaptation of interposer technology is steadily increasing in the semiconductor industry. Interposer technology brings multiples of benefits including enabling heterogeneous die packaging, shorter interconnect lines by means of TSVs, integrated passive devices (IPD), vertical package integration etc. Such integration enables to gain high density I/O so that different types of dies can be located near to each other on a TSV interposer e.g. logic and memory. Such technology is also known as 2.5D packaging technology. Moreover, silicon dies can be stacked tier-to-tier on top of each other, which reduces the physical area for defined components. Such tier-to-tier stacking is called 3D packaging technology.

However, integration of such densely populated dies may come with a price. Many low-power, high speed integrated circuits are extremely sensitive to electrical noise generated by the continuous switching of the transistors located in the circuit blocks. A known solution to this problem is to connect the circuit with a so called decoupling capacitor to minimize the power fluctuation induced noise. A decoupling capacitor essentially stores charge locally, which can then give out required energy to compensate for any sudden fluctuations or voltage variations during transistor switching stages and thereby minimize any voltage noise so that the circuit can continue functioning smoothly, and thereby enhanced performance is achieved.

It is also known that the impact of the inductance becomes more crucial as the frequency of the circuit goes up. Hence, an important improvement is to have such decoupling capacitor as close as possible to the intended circuit, for which it should serve to reduce the parasitic inductance coming from the interconnect lines. Many approaches have been made to produce integrated decoupling capacitor, e.g. exploiting part of gate dielectric layer, exploiting the spaces between the metal layers of the circuit, multi-layer dissimilar materials stacked capacitor structures, etc. Such approaches however suffer from either the need for a substantial footprint of active silicon area, dielectric leakage, parasitic resistance, or are limited by the fundamental limitations in increasing in capacitance per unit area defined by the parallel plate area or from processing complexity or cost. A good example of different approaches is disclosed in the U.S. Pat. 7,416,954B2.

Advantages of having an integrated silicon based capacitor on an interposer are explained in the U.S. Pat. No. 7,518,881B2. Such integration enables to reduce voltage noise on an integrated (IC) circuit device that may be connected to the capacitor integrated interposer. The main advancement of the disclosure was that the capacitor was brought closer to the IC by having it integrated at the surface of the interposer where the IC will be connected. A variation of such an approach is disclosed in U.S. Pat. No. 7,488,624B2 where it is described how to configure multiples of silicon based integrated capacitors in an interposer. Yet another example of an integrated capacitor is disclosed in U.S. Pat. No. 8,618,651B1, where silicon capacitors are formed within blind TSV vias. Another example of silicon trench based capacitor is disclosed in U.S. Pat. No. 9,236,442B2, where high aspect ratio silicon trenches are used to manufacture capacitor devices. A variation of a trench capacitor manufacturing method is disclosed in U.S. Pat. No. 9,257,383B2.

Hence, traditional silicon based embedded high aspect ratio trench capacitor technology has matured to be used for volume production and may be found in today's smartphone packaging. However, given the trend in miniaturization, the potential of the silicon based capacitor technology is limited by the ability to tailor the capacitor density per unit area, undesired parasitic resistances, increased film stress in the silicon substrate during processing, escalated manufacturing complexity and economy of costs per functions.

A typical interposer may be made of a thin slab of bulk semiconductor material e.g. Silicon which may require TSVs as interconnects. The TSV vias may induce reliability challenges due to non-optimal stress distribution from the vias and the mismatch of the coefficient of thermal expansion (CTE) between the bonded substrate and the interposer as disclosed in U.S. Pat. No. 9,349,669 B2. Additionally, the basic trench based capacitor technology for example MIM capacitor can induce significant tensile stress on the silicon with high trench densities and hence can cause a silicon wafer to warp or bow upwards as disclosed in U.S. Pat. No. 8,963,287 B1.

Furthermore, for many integrated circuits, it would be desirable to also store energy locally. However, local energy storage in an integrated circuit requires the use of valuable space and/or processing that either may not be compatible with standard so called front end manufacturing processes or may not be economically advantageous or combination thereof.

Additionally, for many cases for packaging of integrated circuits into a system such as SoC or SiP packaging, it would be desirable to be able to control the thickness of the interposer devices without increasing the processing complexity and/or processing cost. Hence, there are apparently a number of avenues where the interposer assembly technology can further be improved and the present described invention disclosures intends to contribute to enable a smarter, better and cost effective interposer with reduced film stress, better control over the interposer thickness and added functionality to be used as an assembly platform.

SUMMARY

In view of the above-mentioned and other drawbacks of the prior art, it is an object of the present invention to provide for compact local energy storage and/or decoupling in an electronic device.

According to a first aspect of the present invention, it is therefore provided an interposer device for electrically and mechanically interconnecting a first electrical circuit element and a second electrical circuit element, the interposer device having a first side to be electrically and mechanically connected to the first electrical circuit element, and a second side, opposite the first side, to be electrically and mechanically connected to the second electrical circuit element, wherein the interposer device comprises: a first conductor pattern on the first side of the energy storage device, the first conductor pattern defining a portion of the interposer device to be covered by the first electrical circuit element when the first electrical circuit element is electrically and mechanically connected to the first conductor pattern; a second conductor pattern on the second side of the energy storage device to be electrically and mechanically connected to the second electrical circuit element, the second conductor pattern being electrically coupled to the first conductor pattern; and a plurality of nanostructure energy storage devices arranged within the portion of the interposer device to be covered by the first electrical circuit element, each of the nanostructure energy storage devices comprising: at least a first plurality of conductive nanostructures; a conduction controlling material embedding each nanostructure in the first plurality of conductive nanostructures; a first electrode connected to each nanostructure in the first plurality of nanostructures; and a second electrode separated from each nanostructure in the first plurality of nanostructures by the conduction controlling material, wherein at least one of the first electrode and the second electrode is connected to the first conductor pattern to allow electrical connection of the nanostructure energy storage device to the first electrical circuit element.

The first electrode may be conductively connected to the nanostructures, so that DC-current can flow from the first electrode to the nanostructures.

By conduction controlling material should be understood any material that controls, such as prevents, electrical conduction between the second electrode and the nanostructures in the first plurality of nanostructures to allow for energy storage.

Each or either of the first electrical circuit element and the second electrical circuit element may be any electrical part of an electronic device, including, for example, an integrated circuit, a packaged electronic component, or a circuit board like PCB FR-4 substrate.

The first electrical circuit element may have a smaller surface area than the interposer device.

The first conductor pattern may include connectors allowing electrical connection to corresponding connectors comprised in the first electrical circuit element.

The second conductor pattern may include connectors allowing electrical connection to corresponding connectors comprised in the second electrical circuit element.

The first conductor pattern and the second conductor pattern may be capacitively or directly conductively connected to each other. For instance, the interposer device may include a plurality of through-going conductors, interconnecting the first conductor pattern on the first side of the interposer device with the second conductor pattern on the second side of the interposer device.

The present invention contemplates to provides different types of vias for example electrical vias, thermal vias, other functional vias, or scaffold structures to support or compensate for thin film induced stress or CTE mismatch in the interposer.

The present invention is based upon the realization that compact local energy storage and/or efficient and compact decoupling can conveniently be provided using an interposer device comprising a plurality of nanostructure energy storage devices to be covered by the first electrical circuit element. In this way, considerable energy storage capability can be provided without the need for expensive and space consuming external components, and with no or minimal added lateral area. Additionally, the local energy storage capability can be provided to already existing integrated circuits in a very compact fashion. The present invention is also contemplating to enable the freedom to control the vertical thickness of the interposer devices enabling interposer devices that are thin and slick compared to traditional interposer substrates. Furthermore, the interposer device can be processed at higher temperatures than typical integrated circuits, allowing more freedom in the configuration of the nanostructures and/or a more cost-efficient processing.

In embodiments, the present invention thus contemplates to enable integrated capacitor interposer devices that may be tailored to be energy storage devices fulfilling both the capacitor and the energy storing requirements. Embodiments of the interposer device according to the present invention are also contemplated to be suitable to tailor the capacitance energy density needed for a given circuit need or the assembly requirements. Hence, embodiments of the present invention enable freedom of design and geometrical profile, cost effective processing and industrially scalability. In embodiments, the present invention also allows for controlling the growth of nanostructures as electrode materials to influence the electrode properties, crucial effective surface area enhancement and control over geometrical profile of charge storage devices.

In embodiments, the interposer device may further comprise a redistribution layer formed on the insulating material, the redistribution layer comprising a first conducting portion and a second conducting portion at least partly forming the first conductor pattern, and an insulating portion mutually separating the first and second conducting portions.

The first conducting portion may be connected to one of the first electrode and the second electrode of a first nanostructure energy storage device in the plurality of nanostructure energy storage devices; and the second conducting portion may be connected to one of the first electrode and the second electrode of a second nanostructure energy storage device in the plurality of nanostructure energy storage devices, different from the first nanostructure energy storage device.

In embodiments, it is contemplated to have a plurality of conducting electrodes for signal routing purposes or redistribution conducting layers to match with the circuit and signal propagation needs.

In embodiments, the first conducting portion may constitute one of the first electrode and the second electrode, and the second conducting portion may constitute the other one of the first electrode and the second electrode.

According to various embodiments, the conductive nanostructures in the first plurality of conductive nanostructures may be vertical nanostructures.

According to various embodiments, the conductive nanostructures are provided in the form of thin films or stacks of thin films.

The interposer device may comprise a device layer with an insulating device layer portion, and the vertical nanostructures may be grown on the insulating device layer portion.

The use of grown nanostructures allows extensive tailoring of the properties of the nanostructures. For instance, the growth conditions may be selected to achieve a morphology giving a large surface area of each nanostructure, which may in turn increase the energy storage capacity of the nanostructure energy storage device.

The nanostructures may advantageously be carbon nanostructures, such as carbon nanofibers, carbon nanotubes or carbide-derived carbon nanostructures.

The nanostructures may advantageously be nanowires such as copper, aluminum, silver, silicide or other types of nanowires with conductive properties.

The nanostructures may advantageously be in the form of 2D thin film such as graphene, or any other 2D nanostructures film.

According to various embodiments, the first electrode may be arranged between an insulating device layer and each nanostructure in the first plurality of conductive nanostructures. In these embodiments, the nanostructures in the first plurality of nanostructures may be grown from the first electrode, that is, from a conductive material.

According to embodiments, the conduction controlling material may advantageously be arranged as a conformal coating on each nanostructure in the first plurality of conductive nanostructures.

According to embodiments, the second electrode may cover the conduction controlling material.

The second electrode material may advantageously be arranged as a conformal coating over the conduction controlling materials.

In some embodiments, the first electrode may be a continuous electrode layer between the nanostructures in the first plurality of nanostructures and the insulating surface portion of the interposer substrate and the second electrode may be a continuous electrode layer covering the conduction controlling material such that the second electrode is separated from the first plurality of nanostructures by the conduction controlling material. In these embodiments, the conduction controlling material may advantageously be substantially conformal with the nanostructures, to provide for a very large total area of the second electrode.

According to various embodiments, moreover, the nanostructure energy storage device may further comprise a second plurality of conductive nanostructures embedded in the conduction controlling material. As for the nanostructures in the first plurality of nanostructures, the nanostructures in the second plurality of nanostructures may advantageously be vertical nanostructures.

In such embodiments, the second electrode may be conductively connected to each nanostructure in the second plurality of nanostructures.

Each nanostructure in the second plurality of conductive nanostructures may advantageously be grown from the second electrode.

The second electrode, or a portion of the second electrode, may instead be connected to the tip of nanostructures in the second plurality of nanostructures. In such embodiments, the nanostructures may be grown, embedded in the conduction controlling material, and the tips of the nanostructures then be exposed by removal of conduction controlling material, for example through dry or wet etching or polishing.

According to further embodiments, the first electrode, or a portion of the first electrode, may also be connected to the tip of nanostructures in the first plurality of nanostructures. In such embodiments, the nanostructures may be grown, embedded in the conduction controlling material, and the tips of the nanostructures then be exposed by removal of conduction controlling material, for example through dry or wet etching or polishing. Accordingly, both the first electrode and the second electrode may be provided after growth of the nanostructures.

According to various embodiments, the nanostructure energy storage device may comprise a plurality of conductive nanostructures in 2D film form or multiple layers of 2D film form and embedded in the conduction controlling material. As for the nanostructures in 2D film form may advantageously be grown as 2D film nanostructures.

The present invention contemplates to circumvent the issues with the internal stress in the interposer embodiments.

The present invention also contemplates to be used in wafer level processing and panel level processing.

The present invention also contemplates to be used in fan out wafer level packaging.

The present invention contemplates to introduce a bottom up approach to make interposer devices with embedded different functionality including storage devices, vias, thermal management, scaffolds for mechanical and CTE induced mismatch stability, etc.

According to various embodiments, the nanostructure energy storage device may be a nanostructure capacitor, and the conduction controlling material may be a dielectric material. In a nanostructure capacitor, the conduction controlling material provides for energy storage by preventing electrical conduction from the conductive nanostructures in the first plurality of nanostructures to the second electrode. Hereby, energy can be stored through accumulation of charge at the nanostructure—dielectric interface. The dielectric may advantageously be a so-called high-k dielectric. The high k-dielectric materials e.g. be HfOx, TiOx, TaOx or other well-known high k dielectrics. Alternatively, the dielectric can be polymer based e.g. polypropylene, polystyrene, poly(p-xylylene), parylene etc. Other well-known dielectric materials, such as SiOx or SiNx, etc may also be used as the conduction controlling layer. Any other suitable conduction controlling materials may appropriately be used. The conduction controlling materials may be deposited via CVD, thermal processes, ALD or spin coating or spray coating or any other suitable method used in the industry.

According to other embodiments, the nanostructure energy storage device may be a nanostructure battery, and the conduction controlling material may be an electrolyte. In a nanostructure battery, the conduction controlling material provides for energy storage by allowing transport of ions through the electrolyte. Suitable electrolytes may be solid or semi-solid electrolytes, and may be chosen forms of solid crystals, ceramic, garnet or polymers or gel to act as electrolyte e.g. strontium titanate, yttria-stabilized zirconia, PMMA, KOH etc.

The conduction controlling electrolyte materials may be deposited via CVD, thermal processes, or spin coating or spray coating or any other suitable method used in the industry.

The interposer device according to various embodiments of the present invention may be configured to store a relatively large amount of energy to allow the nanostructure energy providing device to provide energy for operation of an integrated circuit connected to the interposer device. According to other embodiments, the nanostructure energy providing device may be configured to store a relatively small amount of energy needed to, for instance, allow the nanostructure energy providing device to function as a de-coupling capacitor to act as an electrical short for RF frequency, limiting the disturbance on the DC lines from voltage harmonic(s) or transient variations.

Moreover, the interposer device according to various embodiments of the present invention may advantageously be included in an electronic device, further comprising a first electrical circuit element electrically and mechanically connected to the first conductor pattern on the first side of the interposer device to thereby cover the portion of the interposer device defined by the first conductor pattern.

The electronic component may be comprised in an electronic device, such as a handheld electronic device.

According to a further aspect of the invention, it is provided an energy storage device to be electrically and mechanically connected to an electrical circuit element, wherein the energy storage device comprises: a conductor pattern defining a portion of the interposer device to be covered by the electrical circuit element when the first electrical circuit element is connected to the first conductor pattern; and a plurality of nanostructure energy storage devices arranged within the portion of the interposer device to be covered by the electrical circuit element, each of the nanostructure energy storage devices comprising: at least a first plurality of conductive nanostructures; a conduction controlling material embedding each nanostructure in the first plurality of conductive nanostructures; a first electrode connected to each nanostructure in the first plurality of nanostructures; and a second electrode separated from each nanostructure in the first plurality of nanostructures by the conduction controlling material, wherein at least one of the first electrode and the second electrode is connected to the conductor pattern to allow electrical connection of the nanostructure energy storage device to the electrical circuit element.

In embodiments, the energy storage device (or the above-mentioned interposer device may be stacked on each other in a multi layer format to increase the number of energy storing devices and power storing density/capability in 3D vertical format. The energy storage device (or interposer device) may be directly connected to each layer through the interconnects in such a way that the energy storage device can receive and store electrical energy, and supply the stored electrical energy to the electronic device connected to it when required.

In embodiments, the energy storage device (or the above-mentioned interposer device) may be comprised in an energy supply system of an electronic device (smart phone, laptop, sensor or any other handheld battery driven device). The energy storage device (or interposer device) may be directly connected to a battery of the electronic device, and/or be included in an energy management system of the electronic device, in such a way that the energy storage device can receive and store electrical energy, and supply the stored electrical energy to the electronic device when required. In particular, such stored energy can be used to either extend the regular batter life time, and/or improve the power management systems and/or tackle any unwanted power surge or ripples (voltage noise) such that extra power needed can be provided instantaneously.

According to another aspect of the present invention, it is provided a method of manufacturing an interposer device for electrically and mechanically interconnecting a first electrical circuit element and a second electrical circuit element, the method comprising the steps of: providing a substrate; forming a first device layer on the substrate, the first device layer comprising an insulating portion and a conducting portion defining a first conductor pattern for electrical connection to the first electrical circuit element, and a first electrode; forming at least a first plurality of conductive nanostructures on the first electrode, in such a way that each nanostructure in the first plurality of nanostructures is electrically connected to the first electrode; embedding each nanostructure in the first plurality of conductive nanostructures in a conduction controlling material, thereby forming a nanostructure energy storage device layer on the first device layer; providing a second electrode in such a way that the second electrode is separated from each nanostructure in the first plurality of nanostructures by the conduction controlling material; forming a second device layer on the nanostructure energy storage device layer, the second device layer comprising an insulating portion and a conducting portion defining a second conductor pattern for electrical connection to the second electrical circuit element; forming conductive structures through the nanostructure energy storage device layer for interconnecting the first conductor pattern and the second conductor pattern; and removing the substrate.

It should be noted that the steps of the method according to various embodiments of the present invention need not necessarily be carried out in any particular order, for instance, the nanostructures can be formed before the second electrode is provided. Alternatively, the second electrode may be provided before formation of the nanostructures. Furthermore, the conductive structures (such as vias) through the nanostructure energy storage device layer may be formed before or after formation of the second device layer or the conductive structures (such as vias or scaffolds) maybe formed before the formation of the nanostructure energy storage device.

The electrodes may be provided in any suitable manner, such as through photo-lithography, sputtering, evaporation, electroforming, silicidation etc.

The dielectric and/or electrolytes may be provided in any suitable manner, such as atomic layer deposition, sputtering, evaporation, spinning, drop casting, etc. or any other suitable method known in the art. In embodiments, the multi-layers of dielectric and/or electrolytes may conveniently be provided according to the need.

According to embodiments, the step of forming the at least first plurality of conductive nanostructures may comprise the steps of: providing a patterned catalyst layer on the first redistribution layer; and growing each nanostructure in the first plurality of conductive nanostructures from the catalyst layer. According to some embodiments, the electrodes may be the same material as the catalyst layer. According to some embodiments, the catalyst layer may conveniently be thick enough to utilize the upper part of the catalyst layer as catalyst to grow nanostructures from and the bottom part to be used as electrodes.

Further embodiments of, and effects obtained through this second aspect of the present invention are largely analogous to those described above for the first aspect of the invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of the energy storing interposer device is mainly described with reference to an energy storing interposer device comprising a nanostructure energy storage device in the form of a nanostructure capacitor.

It should be noted that this by no means limits the scope of the present invention, which equally well includes, for example, an interposer device comprising a nanostructure battery or a nanostructure capacitor and a nanostructure battery.

Figure 1:
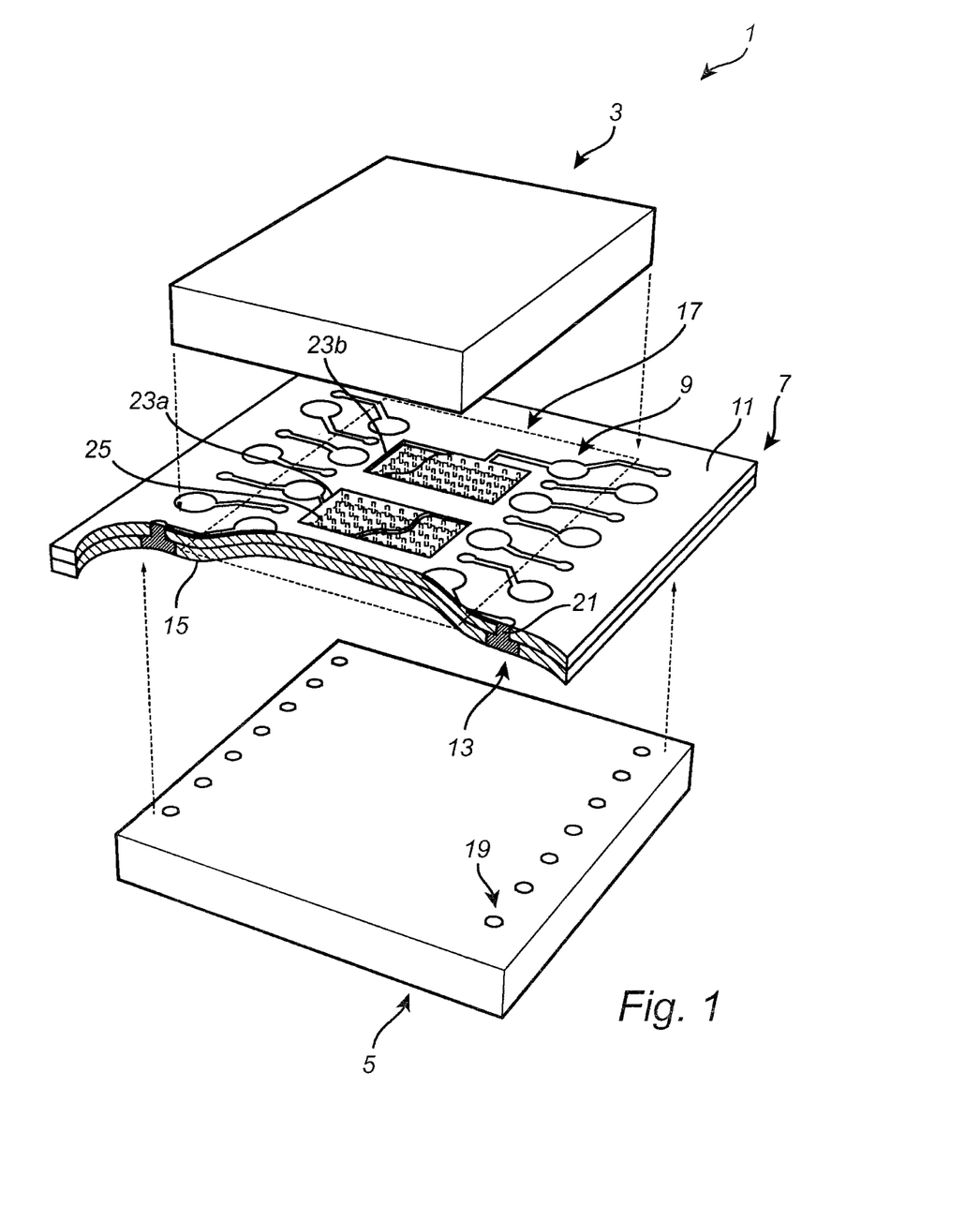
FIG. 1 schematically illustrates an application for an interposer device according to an example embodiment of the present invention, in the form of an electronic assembly.

FIG. 1 schematically illustrates an electronic device 1 according to an embodiment of the present invention, comprising a first electrical circuit element, here in the form of a first integrated circuit (IC) 3, a second electrical circuit element, here in the form of a second IC 5, and an interposer device 7 according to an embodiment of the present invention, electrically and mechanically interconnecting the first IC 3 and the second IC 5.

The interposer device 7 comprises a first conductor pattern 9 on a first side 11 of the interposer device 7, and a second conductor pattern 13 on a second side 15 of the interposer device 7. As is schematically indicated in FIG. 1, the first conductor pattern 9 (the connectors for electrical and mechanical connection of the first IC 3 to the interposer device 7) defines a portion 17 (indicated by the area bounded by the dashed line in FIG. 1) of the interposer device 7 to be covered by the first IC 3 when the first IC is electrically and mechanically connected to the first conductor pattern 9. Similarly, the second conductor pattern 13 is configured to allow electrical and mechanical connection of the corresponding connectors 19 of the second IC 5 to the interposer device 7. As is also schematically shown in FIG. 1, the second conductor pattern 13 is electrically coupled to the first conductor pattern 9, here by vias 21 extending through the interposer device 7.

The interposer device 7 in FIG. 1 additionally comprises first 23a and second 23b nanostructure energy storage devices that are arranged within the portion 17 of the interposer device 7 covered by the first IC 3.

Each of the first 23a and second 23b nanostructure energy storage devices comprises at least a first plurality of conductive nanostructures and a conduction controlling material embedding the nanostructures. These structures are not explicitly shown in FIG. 1, but will be described in greater detail below with reference to FIGS. 2A-B and FIG. 3.

In addition to the above-mentioned conductive nanostructures and conduction controlling material, each of the first 23a and second 23b nanostructure energy storage devices comprises a first electrode 25 (only indicated for the first nanostructure energy storage device in FIG. 1) and a second electrode, which is not visible in the illustration in FIG. 1.

In the example of FIG. 1, the first electrode 25 and the second electrode (although not visible in FIG. 1) are both connected to the first IC 3 (and to the second IC 5) via the first conductor pattern 9 and the second conductor pattern comprised in the interposer device 7. Hereby, the nanostructure energy storage devices 23a-b can, for example, be charged by electrical energy provided from the second IC 5, and discharged to the first IC 3 through the IC connection pads of the first conductor pattern 9. Thus, the interposer device 7 can function as a charge reservoir for the first IC 3 and/or the second IC 5.

It should be noted that many other first and second conductor patterns are possible and may be advantageous depending on the particular application. For example, first and second conductor patterns may be present for power grid and signal routing purposes. According to one example, there may be a third electrical circuit element on the first side of the interposer device, and the first conductor pattern may additionally comprise connectors for such a third electrical circuit element, and to provide signal routing between the first electrical circuit element and the third circuit element.

The structure of the interposer device 7 according to embodiments of the present invention will be described in greater detail in connection with the description of example manufacturing methods further below.

Figure 2A:
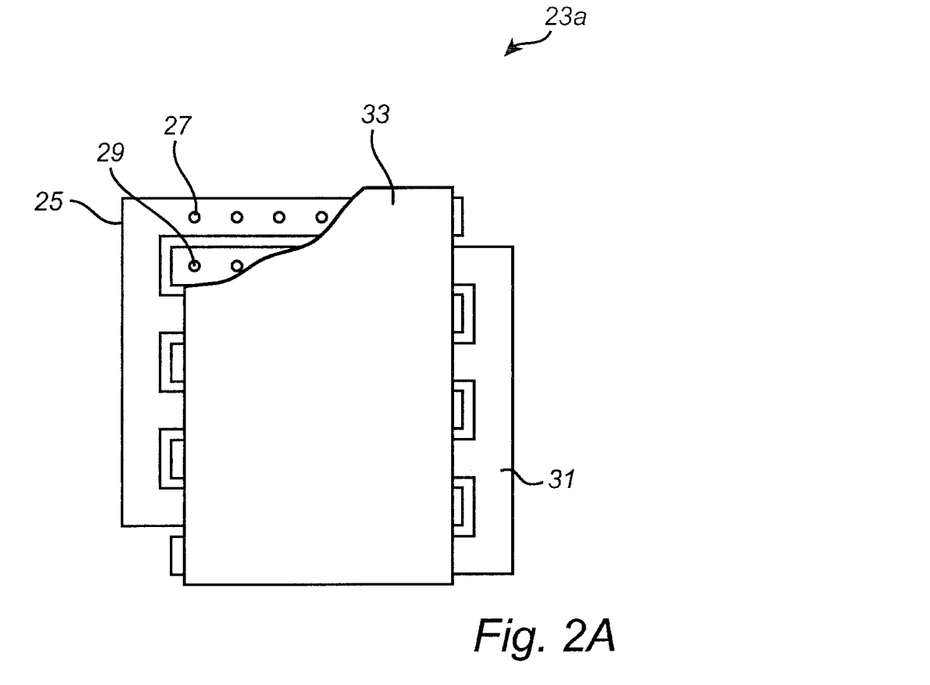
FIGS. 2A-B schematically show two embodiments of the nanostructure energy storage device comprised in the interposer device according to the present invention.

FIG. 2A is a schematic top view of a first example configuration of the first nanostructure energy storage device 23a in FIG. 1, with the conduction controlling material partly removed to expose some of the nanostructures comprised in the nanostructure energy storage device 23a.

Referring to FIG. 2A, the nanostructure energy storage device 23a comprises a first plurality of conductive nanostructures 27 formed on the first electrode 25, and a second plurality of conductive nanostructures 29 formed on the second electrode 31. All nanostructures are embedded in conduction controlling material 33. In this example, the nanostructure energy storage device 23a may be a nanostructure capacitor, in which case the conduction controlling material 33 may be a dielectric material, such as a so-called high-k dielectric.

Figure 2B:
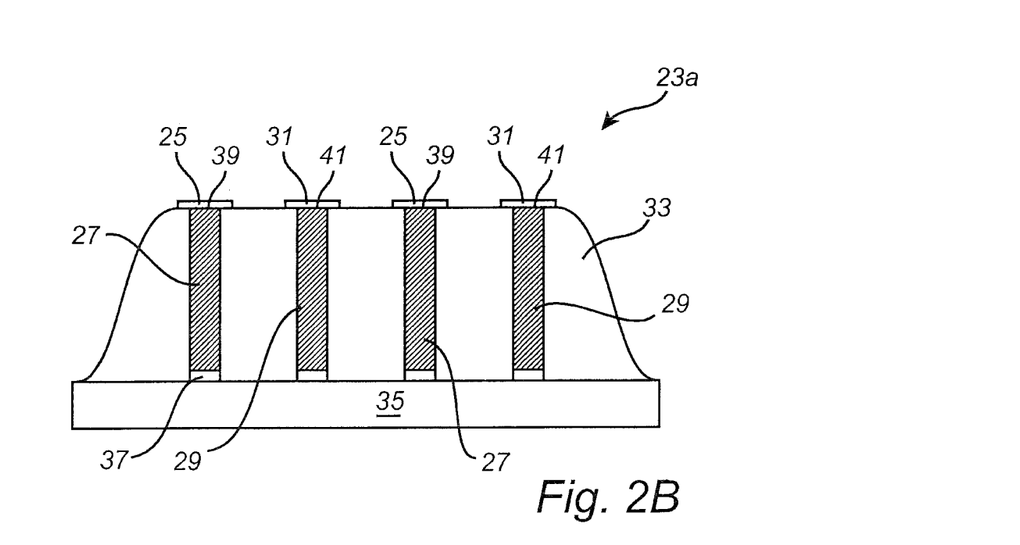

FIG. 2B is a cross-section view from the side schematically showing a second example configuration of the first nanostructure energy storage device 23a in FIG. 1 comprising a first plurality 27 and a second plurality 29 of conductive nanostructures grown from an electrically insulating surface portion of a device layer 35 comprised in the interposer device 7. In particular, the nanostructures may have been grown as a forest from an unpatterned (such as uniform) catalyst layer, or from a patterned catalyst layer 37 as is schematically indicated in FIG. 2B.

The nanostructures are embedded in a conduction controlling material 33, but the tips of the nanostructures have been exposed, for example through polishing or etching of the conducting controlling material 33. On top of the tips 39 of the nanostructures 27 in the first plurality of nanostructures, the first electrode 25 has been provided to achieve electrical contact between the first electrode 25 and each conductive nanostructure 27 in the first plurality of nanostructures. On top of the tips 41 of the nanostructures 29 in the second plurality of nanostructures, the second electrode 31 has been provided to achieve electrical contact between the second electrode 31 and each conductive nanostructure 29 in the second plurality of nanostructures.

Figure 3:
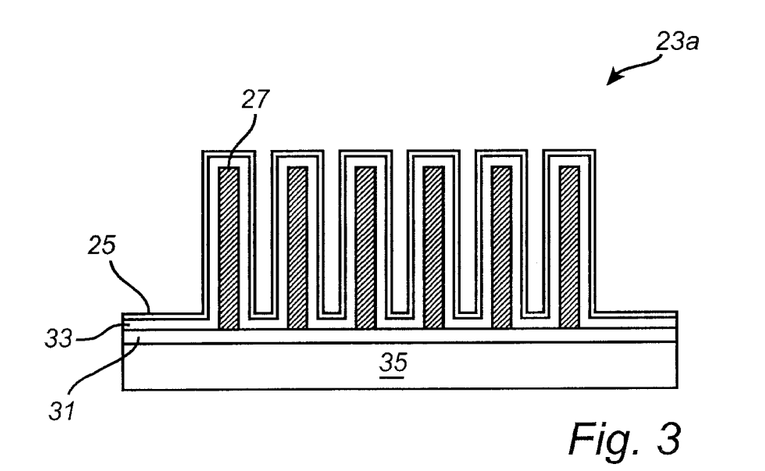
FIG. 3 schematically shows a further embodiment of the nanostructure energy storage device comprised in the interposer device according to the present invention.

FIG. 3 is a cross-section view from the side schematically showing a third example configuration of the first nanostructure energy storage device 23a in FIG. 1. In the embodiment in FIG. 3, there is no second plurality of nanostructures, but all of the nanostructures 27 belong to the above-mentioned first plurality of nanostructures formed on the second electrode 31. Further, the conduction controlling material 33 is provided as a conformal coating on the nanostructures 27, and the first electrode 25 is formed as a conformal coating on the conduction controlling material 33.

Figure 4:
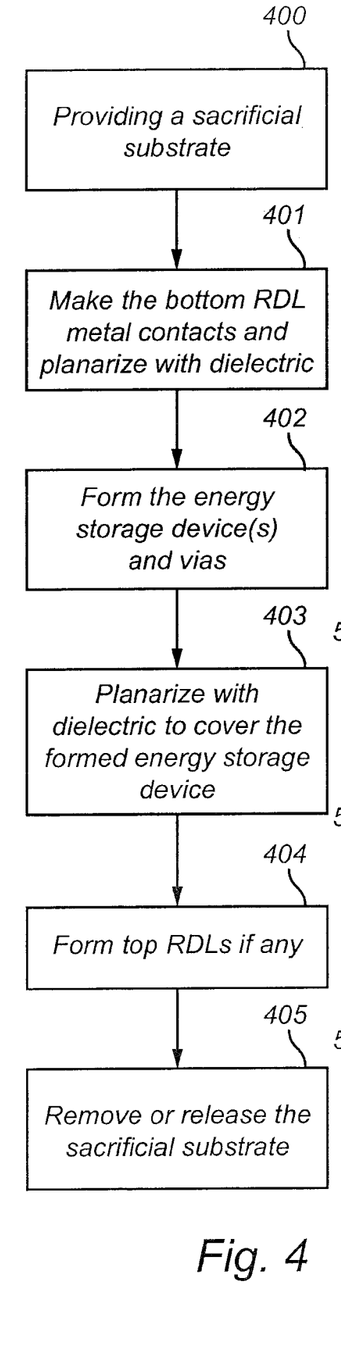
FIG. 4 is a flow-chart illustrating an example embodiment of the manufacturing method according to the present invention.

An example embodiment of the manufacturing method according to the present invention will now be described with reference to the flow-chart in FIG. 4, and the cross-section views in FIGS. 5A-F of different stages in the manufacturing process, corresponding to the respective method steps in the flow-chart in FIG. 4.

Figure 5A:
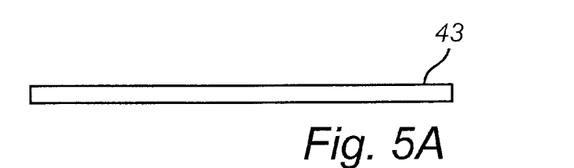
FIGS. 5A-F schematically illustrate the result of the respective method steps in the flow-chart in FIG. 4.

In a first step 400, a sacrificial substrate 43 is provided. The sacrificial substrate may be any suitable substrate as will be well-known to one of ordinary skill in the relevant art. For instance, the sacrificial substrate may be made of polymer or glass, or may be a silicon substrate.

Figure 5B:
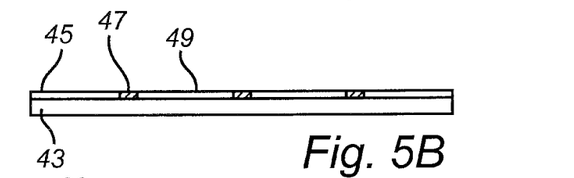

In the subsequent step 401, a device layer 45, is provided. Here, the device layer comprises a first redistribution layer 47 provided on the sacrificial substrate 43, and in insulating device layer portion 49. The device layer be be provided by first forming the first redistribution layer in the desired pattern (such as the above-mentioned first 9 or second 13 conductor pattern) using a suitable metal or other conducting material, depositing a dielectric layer on the first redistribution layer 47 to a thickness, planarizing the dielectric through chemical mechanical polishing or any other suitable methods such that the first redistribution layer becomes exposed and the substrate including the first redistribution layer 47 and the dielectric layer become substantially flat/planar again.

In the next step 402, the nanostructure energy storage devices 23 and vias 46 are formed on the planarized surface of the device layer 45. As was described above with reference to FIGS. 2A-B and FIG. 3, the nanostructure energy storage devices 23 may be formed in various different ways, each including growing conductive vertical nanostructure on the device layer 45, embedding the nanostructures in a conduction controlling material, and forming first and second electrodes.

Figure 5C:
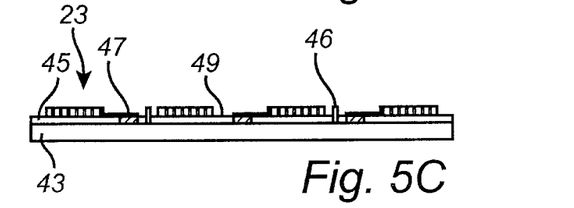

To form the vias 46, typical metal or metal alloys can be deposited utilizing deposition, sputtering, or evaporations or any other wet processes. The vias may have different functions such as for electrical interconnects, thermal interconnects or thermal and mechanical stability interconnects. Given the purpose, the materials for the vias formation maybe chosen from metals or metal alloys with high thermal or electrical conductivity. In an aspect, anisotropic nano materials such as carbon nanotubes, nanofibers, nanowires may also be used. Typical CVD method maybe utilized to grow such nano materials. A composite vias combining nanomaterials and metal may also be used. Vias may be formed to be distributed over an area of interest to fulfil different purposes.

Figure 5D:
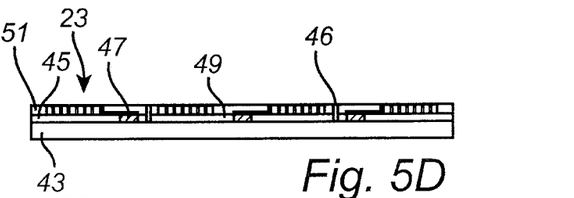

When the vias 46 and nanostructure energy storage devices 23 have been formed, the nanostructure are embedded in a dielectric material in step 403. The vias 46 and the nanostructure energy storage devices 23 may be covered by depositing a layer of dielectric 51. The layer of dielectric may be planarized such that the surface become reasonably planar again. Alternatively, the layer of dielectric may be planarized such that the top surface of the vias becomes open and accessible again.

Figure 5E:
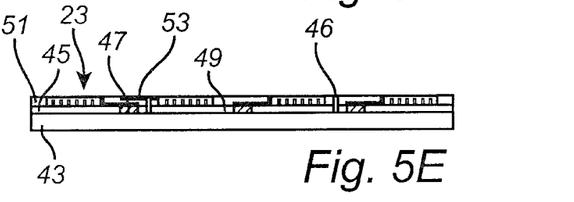

Thereafter, in step 404, a second redistribution layer 53 may optionally be formed to achieve the above-mentioned first 9 or second 13 conductor layer.

Figure 5F:
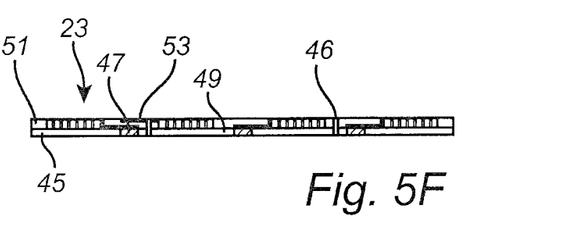

In the next step 405, the sacrificial substrate 43 is removed or released to complete the first example of the energy storing interposer device 7.

The first and second redistribution layers can be manufactured utilizing any known standard metallization processing such as wet chemistry, dry CVD deposition, sputtering or evaporation. The typical metal such as Cu, Al, Au, silicides or any other suitable metal can be deposited according to the need. To form the energy storing devices includes: forming at least a first plurality of conductive nanostructures on the first conducting portion such that they are electrically connected to a first redistribution layer, the first conducting portion forming a first electrode; embedding each nanostructure in the first plurality of conductive nanostructures in a conduction controlling material; providing a second electrode in such a way that the second electrode is separated from each nanostructure in the first plurality of nanostructures by the conduction controlling material. Removing the sacrificial substrate maybe carried out by etching the substrate from the back by chemical etching or dry etching or any other suitable method. Alternatively, the sacrificial substrate maybe released instead of being removed. In such case, wafer release technique, laser de-bonding technique or thermal de-bonding techniques maybe used. An extra layer of suitable materials maybe deposited on the sacrificial substrate prior to the processing of the interposer energy storage device for the wafer release or de-bonding method to work. Optionally, after removal of the sacrificial substrate, the energy storing interposer device may further be processed to form a non planar I/O points by bumping. Such I/O bumps maybe formed via flip chip bumping processes, Cu pillar deposition techniques, or any other suitable wet chemistry processes to form the final connection points.

Alternatively, the processes for forming more layers of interposer device on top of the first interposer device layer may continue according to the processes described above FIG. 5B-FIG. 5E.

In an alternative manufacturing approach, the process may continue without removing the sacrificial substrate to bond it to a next interposer device manufactured according to the method. In such scheme, without removing the sacrificial substrate, two interposer devices are then bonded facing active side to each other. The sacrificial substrate is then removed or de-bonded and the process may continue to stack a number of interposer devices on each other.

In an alternative manufacturing approach, fan out processing may be carried out on top of the interposer device according to standard known fan out processing.

In an alternative manufacturing approach, the process may continue without removing the sacrificial substrate, at least one integrated circuit or die is bonded to the interposer device. The sacrificial substrate is then removed or de-bonded and the process may continue to stack a number of interposer device on each other. Any of the previously described embodiments are suitable to be fabricated at a wafer level processes and panel level processes used in the industry. They may conveniently be referred to as wafer level interposer processing and panel level interposer processing respectively. In wafer level processing typically a circular shaped substrate is used, size ranging from 2 inch to 12 inch wafers. In the panel level processing, the size is defined by the machine capacity and can be circular or rectangular or square ranging larger sizes typically but not limited to 12 to 100 inches. Panel level processing is typically used in producing smart televisions. Hence the size can be as the size of a television or larger. The larger the interposer substrate size, the cost effective it becomes for individual interposer substrate to be used in the semiconductor industry for assembly. In an aspect for wafer level processes, the at least one of the embodiment described above is processed at a wafer level in a semiconductor processing foundry. In another aspect, for panel level processes, the at least one of the embodiments described above is processed using panel level processing. Depending on the design requirements, after processing, the interposer wafer or panel level wafer is cut into smaller pieces utilizing standard dicing, plasma dicing or laser cutting. In another aspect, the dicing, plasma dicing or laser cutting is done after the chips/dies are assembled on the interposer at a wafer or panel level. Such singulation process step can be configured through dicing or plasma dicing or laser cutting to tailor the shape and size of the interposer is formed according to the need.

In an aspect of the use of any one of the above mentioned interposer embodiments, the energy storing interposer may conveniently be connected with the battery and/or power management unit in devices for example, smart phone, laptop, sensors or any other handheld battery driven devices such that the interposer according to the present invention can store energy. Such stored energy can be used either to extend the regular battery life time, and/or to improve the power management systems and/or to tackle any unwanted power surge or ripples (voltage noise) such that extra power needed can be provided instantaneously.

In addition, the following information is provided:

In one aspect of the present invention, there is provided an interposer device suitable for arrangement between plurality of integrated circuits and/or device substrates, the interposer comprising a plurality of energy storage devices, a plurality of vies extending through the interposer device, a plurality of conducting patterns or RDLs on the first side and the second side opposite of the first side such that conducting patterns, energy storage devices and vias can be connected. The conducting patterns are made of metals such as Cu, Al, Au, silicides or any other suitable metal or metal alloys. In an aspect the vias are for electrical interconnects based on metal vias e.g. Cu, Al, W, Au, silicides or any other metal or metal alloys suitable for forming them. The vies may conveniently be made of other types of anisotropic conducting materials such as carbon nanotube, nanofibers or nanowires or in the form of composites with metal or metal alloys. In an another aspect, the vies are thermal vias. Thermal vies can conveniently be formed by high thermal conductive materials e.g. Cu, Au, etc. or anisotropic thermally conducing materials such as nanotubes, nanowires, carbon based materials such as carbon nanotubes, nanofibers, graphene or in the form of composite with other metal or metal alloys. In an aspect, the vias may be formed at the sidewall of the interposer devices. There are essentially no limitations is anticipated on the thickness of the interposer device that maybe manufactured according to the present invention. However, typically, the total thickness of the interposer device may vary from 0.1 µm to 10 mm according to the need/application, preferably between 0.5 µm and 100 µm.

In an aspect of the present invention, there is provided an interposer device suitable for arrangement between a plurality of integrated circuits and/or device substrates, comprising a plurality of energy storage devices, a plurality of conducting patterns or RDLs on the first side and the second side opposite of the first side such that conducting patterns and energy storage devices can be connected. The conducting patterns are made of metals such as Cu, Al, Au, silicides or any other suitable metal or metal alloys. The plurality of integrated circuits then may be connected via the energy storing interposer devices. In an aspect, the vias may be formed at the sidewall of the interposer devices. There are essentially no limitations is anticipated on the thickness of the interposer device that maybe manufactured according to the present invention. However, typically the total thickness of the interposer device may vary from 0.1 µm to 10 mm according to the need, preferably between 0.5 µm and 100 µm.

In an aspect the interposer device, may conveniently have more structures in the form of vias or nanoscale scaffolds for providing other functions such as vias for mechanical stability and may compensate for CTE mismatch of dissimilar integrated circuit substrates or may be used as for compensating or balancing deposition induced thin film stress. In such nanoscale scaffold may conveniently be embedded in the deposited dielectric layer.

In an aspect of the present invention, the dielectric body of the interposer device is formed through deposition processes of dielectric layers.

In one aspect, a fabricated capacitor may be used as decoupling capacitor which will then have the role to act as an electrical short for RF frequency, limiting the disturbance on the DC lines from voltage harmonic(s) or transient variations.

The decoupling capacitors are best used when connected a DC lines to the ground as close as possible from the device. Hence in the present invention, one of the aspects is to position or manufacture such capacitor between two redistribution connecting lines on the surface of the interposer. in another aspect, the capacitor may be positioned or manufactured within the thickness of the interposer or in a recessed format of the interposer or at the bottom surface of the interposer.

In another aspect of using capacitor as a filtering capacitor (similarly to a DC block) should be located in series connection with a RF line and can be integrated within the via of the interposer or on one of the surfaces.

In one aspect of the filtering or de-coupling capacitors, they may be fully solid state devices. Therefore the device should be made of nanostructures connected or grown on the bottom electrode, before an insulating layer is deposited by means of PVD, CVD, ALD, before the top electrode is formed either using PVD, CVD, ALD or plating.

In another aspect for using the capacitor as storing devices, liquid, polymeric or Gel can be used as electrolyte joining two electrodes, located on the top of each other or simply interdigitated.

It should be understood that the conductive nanostructures comprised in the nanostructure energy storage device 23 may be made using various methods known to one of ordinary skill in the art. For example, the method for making one or more nanostructures may include: depositing a conducting helplayer on an upper surface of a substrate; depositing a patterned layer of catalyst on the conducting helplayer; growing the one or more nanostructures on the layer of catalyst; and selectively removing the conducting helplayer between and around the one or more nanostructures. In some implementations, the layer of catalyst is patterned after it is deposited. In some implementations, the substrate additionally comprises a metal underlayer, co-extensive with its upper surface, and which is covered by the conducting helplayer. In some implementations, the metal underlayer is patterned. In some implementations, the metal underlayer comprises one or more metals selected from: Cu, Ti, W, Mo, Co, Pt, Al, Au, Pd, P, Ni, silicide and Fe. In some implementations, the metal underlayer comprises one or more conducting alloys selected from: TiC, TiN, WN, and AlN. In some implementations, the metal underlayer comprises one or more conducting polymers.

The technology described herein can be utilized with a number of different materials as the helplayer. It is important to select helplayer materials and etching parameters so that the nanostructures can be used as a self-aligned mask layer during the etching of the helplayer. The choice of the helplayer material can depend on the material lying beneath the help layer.

The helplayer can also be a catalyst, as the selective removal process can also be used to remove any unwanted catalyst residuals between the grown nanostructures.

The catalyst can be nickel, iron, platinum, palladium, nickel-silicide, cobalt, molybdenum, Au or alloys thereof, or can be combined with other materials (e.g., silicon). The catalyst can be optional, as the technology described herein can also be applied in a catalyst-free growth process for nanostructures. Catalyst can also be deposited through spin coating of catalyst particles.

In some implementation, a layer of catalyst is used to grow the nanostructures as well as to be used as connecting electrodes. In such implementation, the catalyst can be a thick layer of nickel, iron, platinum, palladium, nickel-silicide, cobalt, molybdenum, Au or alloys thereof, or can be combined with other materials from periodic table.

In some implementations, any of the depositing is carried out by a method selected from: evaporating, plating, sputtering, molecular beam epitaxy, pulsed laser depositing, CVD, ALD, spin-coating or spray coating. In some implementations, the one or more nanostructures comprises carbon, GaAs, ZnO, InP, InGaAs, GaN, InGaN, or Si. In some implementations, the one or more nanostructures include nanofibers, nanotubes, or nanowires. In some implementations, the one or more nanostructures are provided in thin film format or a stack of multilayer thin film format. In such implementations, the thin film maybe carbon based graphene film or any other suitable 2D nanostructures. In some implementations, the conducting helplayer comprises a material selected from: a semiconductor, a conducting polymer, and an alloy. In some implementations, the conducting helplayer is from 1 nm to 100 microns thick. In some implementations, the one or more nanostructures are grown in a plasma.

In some implementations, the one or more nanostructures are carbide derived carbon. In some implementations, the selective removal of the conducting helplayer is accomplished by etching. In some implementations, the etching is plasma dry etching. In some implementations, the etching is an electrochemical etching. In some implementations, the etching is photo chemical pyrolysis etching. In some implementations, the etching is pyrolysis etching. In some implementations, the method further includes depositing an additional layer between the conducting help layer and the layer of catalyst.

According to an aspect, growing a plurality of nanostructures may be carried out using a method comprising: depositing a catalyst layer on the electrodes, the catalyst layer comprising grains having an average grain size different from the average grain size of the electrodes, thereby forming a stack of layers comprising the bottom layer and the catalyst layer; heating the stack of layers to a temperature where nanostructures can form and providing a gas comprising a reactant such that the reactant comes into contact with the catalyst layer.

In some implementation, chlorination process may be used to derive carbon nanostructures from metal carbide layer e.g. forming carbon nanostructures from TiC.

In some implementations, growing of nanostructure may be carried out using a method comprising: depositing a stack of layers and growing nanostructures on said stack of layers, wherein said stack of layers comprises materials permitting interdiffusion of said layers. Wherein, the interdiffused layers may conveniently be present in the nanostructures. The stack of layers may be combination of different metals, catalyst metals or metal alloys.

In one aspect, such integration of capacitor is suitable by means of controlling the profile size, height and energy density of the capacitor and/or energy storing devices. In one aspect, such integration is suitable by means of controlling the morphology of the grown nanostructures through growth processes suitably enable high surface area per unit area of the nanostructures.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An interposer device for electrically and mechanically interconnecting a first electrical circuit element and a second electrical circuit element, said interposer device having a first side to be electrically and mechanically connected to said first electrical circuit element, and a second side, opposite the first side, to be electrically and mechanically connected to said second electrical circuit element, wherein said interposer device comprises:
    a first conductor pattern on the first side of said interposer device, said first conductor pattern defining a portion of said interposer device to be covered by said first electrical circuit element when said first electrical circuit element is electrically and mechanically connected to said first conductor pattern;
    a second conductor pattern on the second side of said interposer device to be electrically and mechanically connected to said second electrical circuit element, said second conductor pattern being electrically coupled to said first conductor pattern; and a plurality of nanostructure energy storage devices arranged within the portion of said interposer device to be covered by said first electrical circuit element, each of said nanostructure energy storage devices comprising:
at least a first plurality of conductive nanostructures;
a conduction controlling material embedding each conductive nanostructure in said first plurality of conductive nanostructures;
a first electrode connected to each conductive nanostructure in said first plurality of conductive nanostructures; and
a second electrode separated from each conductive nanostructure in said first plurality of conductive nanostructures by said conduction controlling material,
wherein at least one of said first electrode and said second electrode is connected to said first conductor pattern to allow electrical connection of said nanostructure energy storage device to said first electrical circuit element.

2. The interposer device according to claim 1, wherein said interposer device further comprises insulating material embedding each nanostructure energy storage device in said plurality of nanostructure energy storage devices.

3. The interposer device according to claim 2, wherein said interposer device further comprises a redistribution layer formed on the insulating material, said redistribution layer comprising a first conducting portion and a second conducting portion at least partly forming said first conductor pattern, and an insulating portion mutually separating said first and second conducting portions.

4. The interposer device according to claim 3, wherein:
said first conducting portion is connected to one of the first electrode and the second electrode of a first nanostructure energy storage device in said plurality of nanostructure energy storage devices; and
said second conducting portion is connected to one of the first electrode and the second electrode of a second nanostructure energy storage device in said plurality of nanostructure energy storage devices, different from said first nanostructure energy storage device.

5. The interposer device according to claim 1, wherein, in each nanostructure energy storage device in said plurality of nanostructure energy storage devices, the conductive nanostructures in the first plurality of conductive nanostructures are vertical nano structures.

6. The interposer device according to claim 5, wherein said interposer device comprises a device layer with an insulating device layer portion, said vertical nanostructures being grown on said insulating device layer portion.

7. The interposer device according to claim 6, further comprising a catalyst layer between said insulating device layer portion and said conductive nanostructures in said first plurality of conductive nanostructures.

8. The interposer device according to claim 6, wherein said first electrode is arranged between said insulating device layer and each conductive nanostructure in said first plurality of conductive nanostructures.

9. The interposer device according to claim 8, wherein each conductive nanostructure in said first plurality of conductive nanostructures is grown from said first electrode.

10. The interposer device according to claim 1, wherein, for each nanostructure energy storage device in said plurality of nanostructure energy storage devices, said conduction controlling material is arranged as a conformal coating on each conductive nanostructure in said first plurality of conductive nanostructures.

11. The interposer device according to claim 1, wherein, for each nanostructure energy storage device in said plurality of nanostructure energy storage devices, said second electrode covers said conduction controlling material.

12. The interposer device according to claim 1, wherein each nanostructure energy storage device in said plurality of nanostructure energy storage devices further comprises a second plurality of conductive nanostructures embedded in said conduction controlling material.

13. The interposer device according to claim 12, wherein, for each nanostructure energy storage device in said plurality of nanostructure energy storage devices, said conductive nanostructures in said second plurality of conductive nanostructures are vertical nanostructures grown on an insulating device layer portion of a device layer comprised in said interposer device.

14. The interposer device according to claim 13, wherein, for each nanostructure energy storage device in said plurality of nanostructure energy storage devices, said interposer device further comprising a catalyst layer between said insulating device layer portion and said conductive nanostructures in said second plurality of conductive nano structures.

15. The interposer device according to claim 13, wherein, for each nanostructure energy storage device in said plurality of nanostructure energy storage devices, said second electrode is arranged between said insulating device layer portion and each conductive nanostructure in said second plurality of conductive nanostructures.

16. . The interposer device according to claim 12, wherein, for each nanostructure energy storage device in said plurality of nanostructure energy storage devices, said conduction controlling material is arranged as a conformal coating on each conductive nanostructure in said second plurality of conductive nanostructures.

17. The interposer device according to claim 1, wherein, for each nanostructure energy storage device in said plurality of nanostructure energy storage devices, said conductive nanostructures are carbon nanostructures.

18. The interposer device according to claim 17, wherein said conductive nanostructures are carbon nanofibers.

19. The interposer device according to claim 1, wherein each nanostructure energy storage device in said plurality of nanostructure energy storage devices is a nanostructure capacitor, and said conduction controlling material is a dielectric material.

20. The interposer device according to claim 1, wherein each nanostructure energy storage device in said plurality of nanostructure energy storage devices is a nanostructure battery, and said conduction controlling material is a solid electrolyte.

21. An electronic device comprising:
the interposer device according to claim 1; and
a first electrical circuit element electrically and mechanically connected to the first conductor pattern on the first side of said interposer device to thereby cover said portion of the interposer device defined by said first conductor pattern.

22. The electronic device according to claim 21, wherein said first electrical circuit element is an integrated circuit.

23. The electronic device according to claim 21, wherein said electronic device further comprises a second electrical circuit element electrically and mechanically connected to the second side of said interposer device.

24. The electronic device according to claim 23, wherein said second electrical circuit element is a device substrate.

25. A method of manufacturing an interposer device for electrically and mechanically interconnecting a first electrical circuit element and a second electrical circuit element, said method comprising the steps of:
provided a substrate;
forming a first device layer on said substrate, said first device layer comprising an insulating portion and a conducting portion defining a first conductor pattern for electrical connection to said first electrical circuit element, and a first electrode;
forming at least a first plurality of conductive nanostructures on said first electrode, in such a way that each conductive nanostructure in said first plurality of conductive nanostructures is electrically connected to said first electrode;
embedding each conductive nanostructure in said first plurality of conductive nanostructures in a conduction controlling material, thereby forming a nanostructure energy storage device layer on said first device layer;
providing a second electrode in such a way that said second electrode is separated from each conductive nanostructure in said first plurality of conductive nanostructures by said conduction controlling material;
forming a second device layer on said nanostructure energy storage device layer, said second device layer comprising an insulating portion and a conducting portion defining a second conductor pattern for electrical connection to said second electrical circuit element;
forming conductive structures through said nanostructure energy storage device layer for interconnecting said first conductor pattern and said second conductor pattern; and
removing said substrate.

26. The method according to claim 25, wherein said second electrode is included in the conducting portion of said second device layer.

27. The method according to claim 25, wherein said second electrode is provided to cover each conductive nanostructure in said first plurality of conductive nano structures.

28. The method according to claim 25, further comprising the steps of:

forming a second plurality of conductive nanostructures on said first device layer;
embedding each conductive nanostructure in said second plurality of conductive nanostructures in said conduction controlling material; and
providing said second electrode in such a way that said second electrode is electrically connected to each conductive nanostructure in said second plurality of conductive nano structures.

29. The method according to claim 28, wherein:
the conducting portion of said first device layer further defines said second electrode; and
the conductive nanostructures in said second plurality of conductive nanostructures are formed on said second electrode, in such a way that each conductive nanostructure in said second plurality of conductive nanostructures is electrically connected to said second electrode.

30. The method according to claim 28, further comprising the step of:
partly removing said conduction controlling material from said second plurality of conductive nanostructures to expose tips of conductive nanostructures in said second plurality of conductive nanostructures,
wherein said second electrode is provided to cover said second plurality of conductive nanostructures and make electrical contact with said exposed tips.

31. The method according to claim 25, wherein said step of forming said at least first plurality of conductive nanostructures comprises the steps of:
providing a patterned catalyst layer on said first device layer; and
growing each conductive nanostructure in said first plurality of conductive nanostructures from said catalyst layer.

32. The method according to claim 25, wherein said step of forming said at least first plurality of conductive nanostructures comprises the steps of:
providing a carbide layer on said first device layer; and
creating pores by removing material from said carbide layer.

33. The method according to claim 32, wherein said carbide layer includes titanium, and said pores are created by removing titanium from said carbide layer.

* * * * *